United States Patent
Nishitani

(10) Patent No.: US 7,354,978 B2
(45) Date of Patent: Apr. 8, 2008

(54) SEMICONDUCTOR ENCAPSULANT OF EPOXY RESIN, PHENOLIC RESIN AND TRIAZOLE COMPOUND

(75) Inventor: Yoshinori Nishitani, Tochigi (JP)

(73) Assignee: Sumitomo Bakelite Co., Tokyo (JP)

( * ) Notice: Subject to any disclaimer, the term of this patent is extended or adjusted under 35 U.S.C. 154(b) by 436 days.

(21) Appl. No.: 10/968,208

(22) Filed: Oct. 19, 2004

(65) Prior Publication Data

US 2005/0085568 A1  Apr. 21, 2005

(30) Foreign Application Priority Data

Oct. 20, 2003  (JP)  ............... P2003-358679

(51) Int. Cl.
  *C08K 3/36* (2006.01)
  *C08L 63/00* (2006.01)
  *C08L 63/04* (2006.01)
(52) U.S. Cl. .................. 525/486; 523/457; 523/466; 525/507
(58) Field of Classification Search ............ None
See application file for complete search history.

(56) References Cited

U.S. PATENT DOCUMENTS 6,297,306 B1 * 10/2001 Osada et al. ............ 524/406

FOREIGN PATENT DOCUMENTS

| JP | 54-139998 | | 10/1979 |
|---|---|---|---|
| JP | 54-152100 | | 11/1979 |
| JP | 58-176254 A | * | 10/1983 |
| JP | 58-198525 | | 11/1983 |
| JP | 62-161820 | | 7/1987 |
| JP | 62-209170 | | 9/1987 |
| JP | 62-260344 | | 11/1987 |
| JP | 06-350000 | | 12/1994 |
| JP | 11-029695 | | 2/1999 |
| JP | 2001-106768 | | 4/2001 |
| JP | 2001-106768 A | * | 4/2001 |
| JP | 2003-96268 A | * | 4/2003 |

OTHER PUBLICATIONS

Patent Abstracts of Japan, Derwent and CAPLUS abstracts for Japanese Patent No. 58-198525 A, Sanyu Resin Co., Ltd. Nov. 18, 1983, four pages.*
Patent Abstracts of Japan, Derwent and CAPLUS abstracts for Japanese Patent No. 62-161820 A, Hitachi Chem. Co. Ltd., Jul. 17, 1987, six pages.*

* cited by examiner

*Primary Examiner*—Robert Sellers
(74) *Attorney, Agent, or Firm*—Smith, Gambrell & Russell

(57) ABSTRACT

One of major objects of the invention is to provide an epoxy resin composition and a semiconductor device exhibiting good soldering resistance when being formed on a non-copper frame. Thus, this invention provides an epoxy resin composition for encapsulating a semiconductor comprising (A) an epoxy resin, (B) a phenolic resin, (C) a hardening accelerator, (D) an inorganic filler and (E) a triazole compound, preferably an epoxy resin composition for encapsulating a semiconductor wherein the triazole compound is a compound represented by general formula (1):

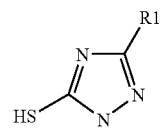

Formula (1)

wherein R1 represents hydrogen atom, or mercapto group, amino group, hydroxyl group or a hydrocarbon chain with 1 to 8 carbon atoms containing one or more of the functional groups as an end group.

2 Claims, No Drawings

SEMICONDUCTOR ENCAPSULANT OF EPOXY RESIN, PHENOLIC RESIN AND TRIAZOLE COMPOUND

This application is based on Japanese patent application NO. 2003-358679, the content of which is incorporated hereinto by reference.

BACKGROUND OF THE INVENTION

1. Field of the Invention

This invention relates to an epoxy resin composition for encapsulating a semiconductor and to a semiconductor device therewith.

2. Description of the Related Art

An epoxy resin composition has been predominantly used for encapsulating a semiconductor device because it has well-balanced properties such as productivity, a cost and reliability. In surface mounting for such a semiconductor device, the semiconductor device is suddenly exposed to an elevated temperature of 200° C. or higher during a solder dipping or solder reflow process, leading to explosive vaporization of absorbed moisture. Such vaporization may generate a sufficient stress to cause peeling in an interface between each plated junction on a semiconductor element, lead frame or inner lead and a cured epoxy resin composition, or cracks in a semiconductor device, leading to significantly lower reliability.

For solving the problem of deteriorated reliability due to soldering, there has been commonly used a technique that a content of an inorganic filler in an epoxy resin composition is increased for reducing moisture absorption, improving strength and reducing thermal expansion to improve soldering resistance and a resin with a lower melt viscosity is used to maintain a lower viscosity and higher flowability during molding.

Meanwhile, adhesiveness in an interface between a cured epoxy resin composition and a base material such as a semiconductor element and a lead frame within a semiconductor device has been significantly important for improving reliability after soldering. When adhesive strength in the interface is weak, peeling may occur in the interface between the cured epoxy resin composition and the base material after soldering, leading to cracks in the semiconductor device.

In order to improve soldering resistance, there have been attempts for improving adhesiveness at the interface between a base material and the cured epoxy resin composition by adding a silane coupling agent such as γ-glycidoxypropyltrimethoxysilane and γ-(methacryloxypropyl)trimethoxysilane to the epoxy resin composition. However, these silane coupling agents alone have become inadequate to meet more strict requirement in soldering resistance in association with a higher reflow temperature during mounting and the use of a pre-plating frame made of Ni, Ni—Pd or Ni—Pd—Au in response to a lead-free solder.

For dealing with the problem, there have been suggested surface treatment of a lead frame with an alkoxysilane coupling agent (e.g., see Japanese Laid-open Patent Application No. 1994-350000) and a resin composition and a resin-encapsulated type semiconductor device containing a thiazole, sulfenamide or thiuram compound (e.g., see Japanese Laid-open Patent Application Nos. 1987-209170 and 1987-260344). However, the silane coupling agent described in Japanese Laid-open Patent Application No. 1994-350000 has a drawback that it is unstable at an elevated temperature, leading to insufficiently improved adhesion after soldering resistance treatment. The compounds described in Japanese Laid-open Patent Application Nos. 1987-209170 and 1987-260344 have a higher molecular weight and contain many unstable bonds such as nitrogen-sulfur bond, and thus it is believed to be possibly decomposed in a encapsulating resin after molding.

SUMMARY OF THE INVENTION

From one of the viewpoints, a object of the invention is to provide an epoxy resin composition and a semiconductor device exhibiting good soldering resistance in which peeling from a lead frame does not occur during soldering after moisture absorption.

According to the present invention, there are provided the followings.

[1] An epoxy resin composition for encapsulating a semiconductor comprising (A) an epoxy resin, (B) a phenolic resin, (C) a hardening accelerator, (D) an inorganic filler and (E) a triazole compound.

[2] The epoxy resin composition for encapsulating a semiconductor according to [1], wherein the triazole compound is a compound having a 1,2,4-triazole ring.

[3] The epoxy resin composition for encapsulating a semiconductor according to [1], wherein the triazole compound is a compound represented by general formula (1):

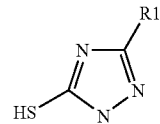

Formula (1)

wherein R1 represents hydrogen atom, or mercapto group, amino group, hydroxy group or a hydrocarbon chain with 1 to 8 carbon atoms containing one or more of the functional groups as an end group.

[4] The epoxy resin composition for encapsulating a semiconductor according to [1] to [3], wherein the triazole compound is contained in an amount of 0.01 to 2% by weight to the total amount of the resin composition.

[5] A semiconductor device wherein a semiconductor element is encapsulated using the epoxy resin composition according to [1] to [4].

A semiconductor device prepared using an epoxy resin composition of the present invention has a characteristic that peeling from a lead frame is prevented even during soldering after moisture absorption, resulting in reliable resistance to soldering. The epoxy resin composition of this invention can be, therefore, extensively used for a variety of resin encapsulating type semiconductor devices. In particular, significant improvement can be achieved in adhesiveness between a cured resin composition and a plated lead frame (e.g., a silver-plated lead frame, a nickel-plated lead frame, a pre-plating frame in which a nickel/palladium alloy is plated with gold). Thus, the composition can be suitably used in a semiconductor device using a plated lead frame.

Since the epoxy resin composition of the present invention has a characteristic that peeling from a lead frame is prevented even during soldering after moisture absorption, a semiconductor device prepared using the composition is reliably resistant to soldering.

DETAILED DESCRIPTION OF PREFERRED EMBODIMENTS

The present invention provides an epoxy resin composition exhibiting good soldering resistance without peeling from a lead frame during soldering after moisture absorption because it contains an epoxy resin, a phenolic resin, a hardening accelerator, an inorganic filler and a triazole compound. This invention will be described in detail.

An epoxy resin used in the present invention may be generally selected from monomers, oligomers and polymers having two or more epoxy groups in one molecule, including, but not limited to, hydroquinone type epoxy resins, bisphenol-A type epoxy resins, bisphenol-F type epoxy resins, biphenyl type epoxy resins, stilbene type epoxy resins, phenol novolac type epoxy resins, cresol novolac type epoxy resins, naphthol novolac type epoxy resins, triphenolmethane type epoxy resin, alkyl-modified triphenolmethane type epoxy resins, dicyclopentadiene-modified phenol type epoxy resins, phenolaralkyl type epoxy resins (having, for example, a phenylene or biphenylene structure in the main chain), naphtholaralkyl type epoxy resins (having, for example, a phenylene or biphenylene structure in the main chain), terpene-modified phenol type epoxy resins and triazine-core containing epoxy resins. These epoxy resins can be used alone or in combination of two or more.

A phenolic resin used in the present invention may be generally selected from monomers, oligomers and polymers having two or more phenolic hydroxy groups in one molecule, including, but not limited to, phenol novolac type resins, cresol novolac type resins, phenolaralkyl type resins (having, for example, a phenylene or biphenylene structure in the main chain), naphtholaralkyl type resins (having, for example, a phenylene or biphenylene structure in the main chain), terpene-modified phenolic resins, dicyclopentadiene-modified phenolic resins, triphenolmethane type phenolic resins and bisphenol compounds. The phenolic resins may be used alone or in combination of two or more.

An equivalent ratio of epoxy groups in the total epoxy resins to phenolic hydroxy groups in the total phenolic resins is preferably 0.5 to 2.0, particularly preferably 0.7 to 1.5. Beyond the range, curing properties, moisture resistance and the like may be deteriorated.

A hardening accelerator used in the present invention may be any compound which can act as a catalyst for a crosslinking reaction of an epoxy resin with a phenolic resin. Thus, it may be a compounds commonly used for a encapsulating material, including, but not limited to, amines such as tributylamine and 1,8-diazabicyclo[5.4.0]undecene-7; organophosphorous compounds such as triphenylphosphine and tetraphenylphosphonium tetraphenylborate; and imidazoles such as 2-methylimidazole. These hardening accelerators may be used alone or in combination of two or more.

An inorganic filler used in the present invention may be selected from those commonly used for an epoxy resin composition for encapsulating a semiconductor, including fused silica, crystalline silica, alumina, silicon nitride and aluminum nitride. These inorganic fillers may be used alone or in combination of two or more.

When increasing a blending quantity of an inorganic filler, it is common to used fused silica. Fused silica may be either crushed or spherical, but it is preferable to mainly use spherical fused silica for increasing a blending quantity of the fused silica and preventing increase in a melt viscosity of an epoxy resin composition. For further increasing a blending quantity of the spherical fused silica, it is desirable to select spherical fused silica with broader particle size distribution. The surface of the inorganic filler may be pre-treated with, for example, a silane coupling agent.

A triazole compound used in the present invention is a compound having a nitrogen-containing five-membered ring structure. Since the triazole compound can improve affinity of a resin composition to a pre-plating frame surface to prevent peeling in an interface, it can improve moisture resistance and reflow-cracking resistance of a semiconductor device in which a semiconductor element is encapsulated with a cured resin composition, resulting in improved reliability of the semiconductor device.

A triazole compound used in the present invention is a compound having a 1,2,4-triazole ring and 1,2,3-triazole ring; for example those compounds as shown by the formulas below.

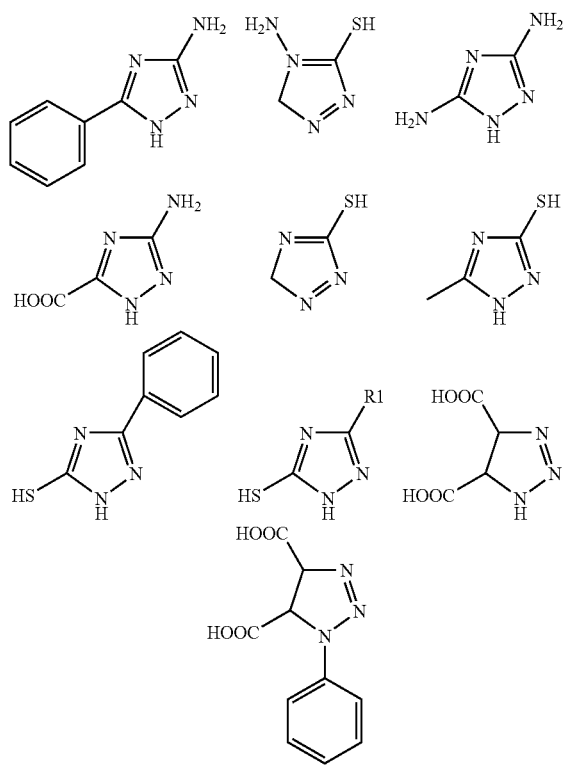

Of these compounds, a compound represented by the following general formula (1) is preferred. In particular, the compound of general formula (1) essentially comprises a mercapto group, which is reactive to a metal. Thus, soldering resistance can be achieved even when a semiconductor device is mounted on a non-copper frame, and the semiconductor device can be encapsulated with such a compound to improve reliability of the semiconductor device.

Formula (1)

wherein R1 represents hydrogen atom, or mercapto group, amino group, hydroxyl group or a hydrocarbon chain with 1 to 8, preferably 1 to 6 carbon atoms containing one or more of these mentioned functional groups as an end group.

Specific examples of the compound are listed below.

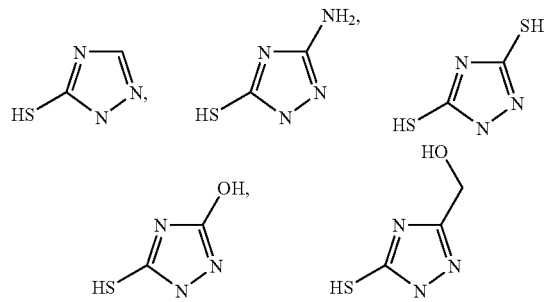

A content of the triazole compound used in the present invention is preferably, but not limited to, 0.01 to 2% by weight to the total amount of a resin composition. The triazole compound can be used in an amount within the range in a composition for encapsulating a semiconductor, to achieve good balance between adhesiveness of the composition to a frame and flowability of the composition and to keep good soldering resistance.

An epoxy resin composition of this invention may contain, in addition to an epoxy resin, a phenolic resin, an inorganic filler, a hardening accelerator and a triazole compound, if necessary, various additives including a coupling agent such as silane coupling agents, titanate coupling agents, aluminum coupling agents and aluminum/zirconium coupling agents; a flame retardant such as brominated epoxy resins, antimony oxide and phosphorous compounds; an inorganic ion-exchanger such as bismuth oxide hydrate; a coloring agent such as carbon black and Indian red; a stress reducer such as silicone oils and silicone rubbers; a mold release such as natural waxes, synthetic waxes, higher fatty acids and their metal salts and paraffins; and an antioxidant as appropriate.

An epoxy resin composition of the present invention can be prepared by mixing an epoxy resin, a phenolic resin, an inorganic filler, a hardening accelerator, a triazole compound and other additives using a mixer, kneading the mixture using a kneading machine such as a roller, a kneader and an extruder, and then milling the product after cooling.

For manufacturing a semiconductor device by encapsulating an electric part such as a semiconductor element with an epoxy resin composition of this invention, molding can be conducted an appropriate process such as transfer molding, compression molding and injection molding.

EXAMPLE

This invention will be described with reference to, but not limited to, Experimental Examples. In the description, contents are expressed in parts by weight.

Experimental Example 1

An epoxy resin represented by formula (2) (softening point: 58° C., epoxy equivalent: 272; hereinafter, referred to as "Epoxy resin 1"): 8.2 parts by weight

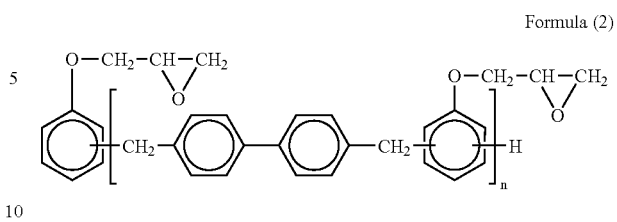

Formula (2)

A phenolic resin represented by formula (3) (softening point: 107 degrees centigrade, hydroxy equivalent: 200; hereinafter, referred to as "Phenolicresin1"): 6.0 parts by weight

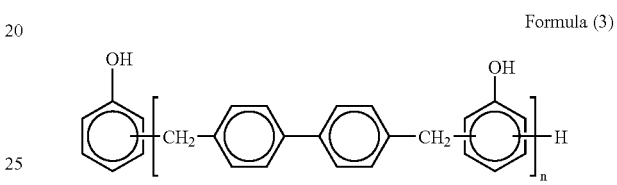

Formula (3)

An equivalent ratio of epoxy groups in the total epoxy resins to phenolic hydroxy groups in the total phenolic resins is calculated as 1.0.

1,8-Diazabicyclo[5.4.0]undecene-7 (hereinafter, referred to as "DBU"): 0.2 parts by weight.

Spherical fused silica (Micron Co., Ltd., average particle size: 28 μm): 85.0 parts by weight.

1,2,4-Triazole-5-thiol represented by formula (4) (Reagent Grade): 0.1 parts by weight

Formula (4)

Carnauba wax: 0.2 parts by weight
Carbon black: 0.3 parts by weight.

These components were mixed using a mixer, kneaded using two rolls with surface temperature of 90 degrees centigrade and 25 degrees centigrade, repectively, and after cooling, milled to obtain an epoxy resin composition. The properties of the epoxy resin composition thus obtained were evaluated as follows. The results are shown in Table 1.

Evaluation Method

Spiral flow: determined in cm using a mold for spiral flow determination in accordance with EMMI-1-66, under the conditions of a mold temperature: 175 degrees centgrade, an injection pressure: 6.9 MPa and a curing time: 120 sec. It is known that a spiral flow of 80 cm or less leads to defective molding such as an unfilled package. Thus, this parameter can be used as an index of reliability of a semiconductor device.

Adhesive strength: a transfer molding machine was used to form test pieces for adhesive strength with a size of 2 mm×2 mm×2 mm (10 pieces/level) on a lead frame under the conditions of a mold temperature: 175 degrees centigrade, an injection pressure: 9.8 MPa and a curing time: 120 sec. Lead frames used were two types: a copper frame plated with silver (Frame 1) and an NiPd alloy frame with gold (Frame 2). Then, an automatic shear-strength measuring device (DAGE Inc., PC2400) was used to determine shear strength of a cured epoxy resin composition and a lead frame. A measured shear strength was given as an average of 10 pieces in N/mm².

Soldering resistance: a 176-pin LQFP package (a package size: 24×24 mm, a thickness: 2.0 mm, a silicon chip size: 8.0×8.0 mm, a lead frame: a 176-pin pre-plating frame made of an NiPd alloy plated with Au) was transfer-molded under the conditions of a mold temperature: 175 degrees centigrade, an injection pressure: 9.3 MPa, a curing time: 120 sec, and then post-cured at 175 degrees centigrade for 8 hours. The resulting package was humidified under the conditions of a temperature: 85 degrees centigrade and a relative humidity: 60% for 168 hours. Then, the package was immersed in a solder bath at 260 degrees centigrade for 10 sec. The immersed package in the solder was observed using an ultrasonic test equipment to determine a peeling incidence in an interface between the chip (SiN coated chip) and an cured epoxy resin composition[(the number of peeled packages)/(the total number of packages)×100] in %. A peeling incidence of 10% or less seems to indicate a reliable package.

Experimental Examples 2 to 15

According to blending rates in Tables 1 and 2, epoxy resin compositions were prepared and evaluated as described in Experimental Example 1. The results are shown in Tables 1 and 2. Specific epoxy resins and phenolic resins used are shown in Table 3. Triazole compounds used in the experiments other than Experimental Example 1 are as follows.

3-Amino-1,2,4-triazole-5-thiol represented by formula (5) (Reagent grade)

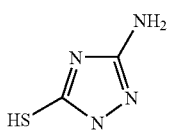

Formula (5)

3,5-Dimercapto-1,2,4-triazole represented by formula (6) (Reagent grade)

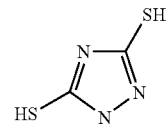

Formula (6)

3-Hydroxy-1,2,4-triazole-5-thiol represented by formula (7) (Reagent grade)

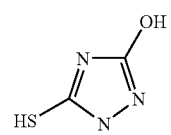

Formula (7)

5-Mercapto-1,2,4-triazole-3-methanol represented by formula (8) (Reagent grade)

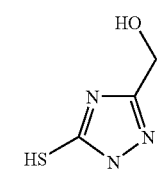

Formula (8)

2-(4'-Morpholinodithio)benzothiazole represented by formula (9) (Kawaguchi Chemical Industry Co,. Ltd.).

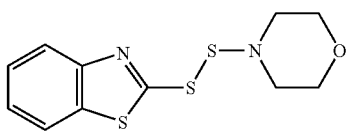

Formula (9)

TABLE 1

| | Experimental Examples | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| Epoxy resin 1 | 8.2 | 8.2 | 8.2 | 8.2 | 8.2 | | | | | | 7.1 | 6.5 |
| Epoxy resin 2 | | | | | | 7.4 | 7.4 | 7.4 | 7.4 | 7.4 | | |
| Phenolic resin 1 | 6.0 | 6.0 | 6.0 | 6.0 | 6.0 | | | | | | 5.2 | 4.8 |
| Phenolic resin 2 | | | | | | 6.8 | 6.8 | 6.8 | 6.8 | 6.8 | | |
| (Equivalent ratio of epoxy/phenolic hydroxy group) | 1.0 | 1.0 | 1.0 | 1.0 | 1.0 | 1.0 | 1.0 | 1.0 | 1.0 | 1.0 | 1.0 | 1.0 |
| DBU | 0.2 | 0.2 | 0.2 | 0.2 | 0.2 | 0.2 | 0.2 | 0.2 | 0.2 | 0.2 | 0.2 | 0.2 |
| Spherical fused silica | 85.0 | 85.0 | 85.0 | 85.0 | 85.0 | 85.0 | 85.0 | 85.0 | 85.0 | 85.0 | 85.0 | 85.0 |
| 1,2,4-Triazole-5-thiol (Formula (4)) | 0.1 | | | | | 0.1 | | | | | 2.0 | 3.0 |
| 3-Amino-1,2,4-triazole-5-thiol (Formula (5)) | | 0.1 | | | | | 0.1 | | | | | |
| 3,5-Dimercapto-1,2,4-triazole (Formula (6)) | | | 0.1 | | | | | 0.1 | | | | |
| 3-Hydroxy-1,2,4-triazole-5-thiol (Formula (7)) | | | | 0.1 | | | | | 0.1 | | | |

TABLE 1-continued

| | Experimental Examples | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| 5-Mercapto-1,2,4-triazole-3-methanol (Formula (8)) | | | | | 0.1 | | | | | 0.1 | | |
| 2-(4'-Morpholinodithio)benzothiazole (Formula (9)) | | | | | | | | | | | | |
| Carnauba wax | 0.2 | 0.2 | 0.2 | 0.2 | 0.2 | 0.2 | 0.2 | 0.2 | 0.2 | 0.2 | 0.2 | 0.2 |
| Carbon black | 0.3 | 0.3 | 0.3 | 0.3 | 0.3 | 0.3 | 0.3 | 0.3 | 0.3 | 0.3 | 0.3 | 0.3 |
| Spiral flow [cm] | 95 | 85 | 90 | 95 | 95 | 100 | 90 | 90 | 95 | 95 | 85 | 80 |
| Adhesive strength [N/mm2] Frame 1 | 10.4 | 12.5 | 11.4 | 9.8 | 9.5 | 11.8 | 14.1 | 13.5 | 11.1 | 10.1 | 10.5 | 10.0 |
| Frame 2 | 10.7 | 11.8 | 11.3 | 9.5 | 9.0 | 11.5 | 13.6 | 13.1 | 10.7 | 9.6 | 10.3 | 9.7 |
| Soldering resistance Chip peeling incidence (%) | 0 | 0 | 0 | 0 | 0 | 0 | 0 | 0 | 0 | 0 | 0 | 0 |
| Inner-lead peeling incidence (%) | 0 | 0 | 0 | 0 | 0 | 0 | 0 | 0 | 0 | 0 | 10 | 10 |

TABLE 2

| | Exp. Examples | | |
|---|---|---|---|
| | 13 | 14 | 15 |
| Epoxy resin 1 | 8.2 | | 8.2 |
| Epoxy resin 2 | | 7.4 | |
| Phenolic resin 1 | 6.0 | | 6.0 |
| Phenolic resin 2 | | 6.8 | |
| (Equivalent ratio of epoxy/phenolic hydroxy group) | 1.0 | 1.0 | 1.0 |
| DBU | 0.2 | 0.2 | 0.2 |
| Spherical fused silica | 85.0 | 85.0 | 85.0 |
| 2-(4'-Morpholinodithio)benzothiazole (Formula (9)) | | | 0.1 |
| Carnuaba wax | 0.2 | 0.2 | 0.2 |
| Carbon black | 0.3 | 0.3 | 0.3 |
| Spiral flow [cm] | 95 | 105 | 80 |
| Adhesive strength [N/mm²] Frame 1 | 3.0 | 3.8 | 5.6 |
| Frame 2 | 2.2 | 3.1 | 5.1 |
| Soldering resistance Chip peeling incidence (%) | 40 | 30 | 30 |
| Inner-lead peeling incidence (%) | 30 | 30 | 20 |

TABLE 3

| | | Manufacturer | Trade name | Description |
|---|---|---|---|---|
| Epoxy resin 1 | Phenolaralkyl type epoxy resin having a biphenylene | Nippon Kayaku | NC-3000P | Softening Point: 58° C. Epoxy eq.: 272 |
| Epoxy resin 2 | Biphenyl type epoxy resin | Japan Epoxy Resins | YX-4000HK | Melting point: 105° C. Epoxy eq.: 190 |
| Phenolic resin 1 | Phenolaralkyl resin having a biphenylene structure | Meiwa Chemicals | MEH7851SS | Softening point: 107° C. Hydroxy eq.: 200 |
| Phenolic resin 2 | p-Xylene-modified novolac type phenol resin | Mitsui Chemicals | XLC-LL | Softening point: 77° C. Hydroxy eq.: 174 |

The results from Experimental Examples 1 to 5 show that an epoxy resin composition comprising a triazole compound has improved affinity to a pre-plating lead frame, resulting in a highly reliable package. Comparable results were obtained when replacing a substituent other than thiol with hydrogen or a functional group reactive to an epoxy resin. In Experimental Examples 6 to 10, adding a triazole compound can improve package reliability although varying depending on the types of the resins. In Experimental Examples 11 and 12 as a system to which a large amount of a triazole compound was added, reliability maybe improved while flowability may be reduced. In Experimental Examples 13 and 14 as a system without a triazole compound, package reliability was lower irrespective of the types of the resins. In Experimental Example 15 in which a triazole compound was replaced with 2-(4'-morpholinodithio)benzothiazole (Formula (9)), the compound has a substantially larger molecular weight than the compounds used in this invention. Thus, although the compound of Formula (9) was used in the same amount as that for the triazole compounds used in Experimental Examples 1 to 12, its effect is insufficient in a particular concentration, resulting in reduced adhesive strength and poor soldering resistance.

What is claimed is:

1. An epoxy resin composition for encapsulating a semiconductor essentially comprising (A) an epoxy resin, (B) a phenolic resin, (C) a hardening accelerator, (D) an inorganic filler and (E) a triazole compound represented by general formula (1):

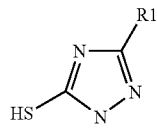

Formula (1)

wherein R1 represents hydrogen atom, or mercapto group, amino group, hydroxyl group or a hydrocarbon chain with 1 to 8 carbon atoms containing one or more of the functional groups as an end group and wherein the triazole compound is contained in an amount of 0.01 to 2% by weight to the total amount of the resin composition.

2. A semiconductor device wherein a semiconductor element is encapsulated using the epoxy resin composition according to claim 1.

* * * * *